United States Patent
Yang et al.

(10) Patent No.: US 7,661,465 B2
(45) Date of Patent: Feb. 16, 2010

(54) INTEGRATED COOLING SYSTEM WITH MULTIPLE CONDENSING PASSAGES FOR COOLING ELECTRONIC COMPONENTS

(75) Inventors: Chih-Hao Yang, Tu-Cheng (TW); Che-Cheng Hu, Tu-Cheng (TW)

(73) Assignee: Hon Hai Precision Industry Co., Ltd., Tu-Cheng, Taipei Hsien (TW)

(*) Notice: Subject to any disclaimer, the term of this patent is extended or adjusted under 35 U.S.C. 154(b) by 532 days.

(21) Appl. No.: 11/309,516

(22) Filed: Aug. 16, 2006

(65) Prior Publication Data

US 2008/0041565 A1 Feb. 21, 2008

(51) Int. Cl.
H05K 7/20 (2006.01)
(52) U.S. Cl. ............ 165/104.26; 165/104.33; 257/715; 361/700
(58) Field of Classification Search ............ 165/104.26, 165/104.33; 257/715; 361/700
See application file for complete search history.

(56) References Cited

U.S. PATENT DOCUMENTS

| | | | | |
|---|---|---|---|---|
| 4,335,781 | A * | 6/1982 | Duffy | 165/104.33 |
| 5,390,077 | A * | 2/1995 | Paterson | 361/700 |
| 5,647,430 | A * | 7/1997 | Tajima | 165/104.33 |
| 5,998,863 | A * | 12/1999 | Kobayashi et al. | 257/715 |
| 6,227,288 | B1 | 5/2001 | Gluck et al. | |
| 6,588,498 | B1 * | 7/2003 | Reyzin et al. | 165/104.33 |
| 6,705,390 | B2 * | 3/2004 | Ohara | 165/104.33 |
| 6,834,713 | B2 * | 12/2004 | Ghosh et al. | 165/104.33 |
| 6,863,119 | B2 * | 3/2005 | Sugito et al. | 165/104.33 |
| 6,913,072 | B2 * | 7/2005 | Luo | 165/104.33 |
| 7,128,134 | B2 * | 10/2006 | Shih et al. | 165/104.26 |
| 2002/0166655 | A1 * | 11/2002 | Sugito et al. | 165/104.33 |

FOREIGN PATENT DOCUMENTS

| | | |
|---|---|---|
| CN | 1403777 A | 3/2003 |
| CN | 200410068769.3 | 9/2004 |
| TW | 573759 | 1/2004 |
| TW | M277985 | 10/2005 |
| TW | M278953 | 10/2005 |
| TW | M281394 | 11/2005 |

* cited by examiner

*Primary Examiner*—Leonard R Leo
(74) *Attorney, Agent, or Firm*—Frank R. Niranjan

(57) ABSTRACT

A cooling system for removing heat from a heat generating component, includes a base (100) and a heat sink (200) mounted on the base. The base includes a lower portion and a higher portion surrounding the lower portion. The lower portion and the higher portion cooperatively define a space (18) receiving working fluid therein. The heat sink defines an evaporating passage (252) and two condensing passages (254) located at two opposite sides of the evaporating passage. These passages are in fluid communication with the space. Cooperatively the space and the passages define a loop for circulating the working fluid therein. The working fluid has a phase change for dissipating heat generated by a heat-generating electronic component. A wick structure (400) is received in the space.

14 Claims, 5 Drawing Sheets

INTEGRATED COOLING SYSTEM WITH MULTIPLE CONDENSING PASSAGES FOR COOLING ELECTRONIC COMPONENTS

CROSS-REFERENCES TO RELATED APPLICATION

This application is related to co-pending U.S. patent application Ser. No. 11/309,293, filed on Jul. 21, 2006, entitled "INTEGRATED COOLING SYSTEM FOR ELECTRONIC COMPONENTS" and filed with the same assignee as the instant application. The disclosure of the above-identified application is incorporated herein by reference.

FIELD OF THE INVENTION

The present invention relates generally to a cooling device, and more particularly to a cooling system with an integrated structure. The cooling system can be suitably applied for removing heat from heat generating electronic components.

DESCRIPTION OF RELATED ART

Along with fast developments in electronic information industries, electronic components such as central processing units (CPUs) of computers are made capable of operating at a much higher frequency and a faster speed. As a result, the heat generated by the CPUs during normal operation is commensurately increased. If not quickly removed away from the CPUs this generated heat may cause them to become overheated and finally affect the workability and stability of the CPUs. In order to remove the heat from the CPUs and hence keep the CPUs in normal working temperature, cooling devices must be provided to the CPUs to dissipate the heat therefrom. Conventionally, extruded heat sinks combined with electric fans are frequently used for this heat dissipation purpose. However, these conventional cooling devices are unsatisfactory at cooling down the current high speed CPUs.

It is well known that the heat transfer efficiency by phase change of liquid (i.e. from liquid to vapor) is hundred times more than that of other mechanisms, such as heat conduction or heat convection without phase change. Accordingly, cooling devices with phase change have been developed. As a more effective cooling device, the cooling system generally includes a heat absorbing member filled with liquid coolant and a heat dissipating member. In practice, these components are connected together in series by a plurality of pipes so as to form a heat transfer loop through which the liquid coolant is circulated. The heat absorbing member is maintained in thermal contact with a heat generating component such as a CPU for absorbing the heat generated by the heat generating component. The liquid coolant in the heat absorbing member absorbs the heat and becomes vapor. The vapor flows through the heat transfer loop to the heat dissipating member so as to bring the heat of the heat generating component from the heat absorbing member to the heat dissipating member for dissipation. The vapor is then condensed into liquid and flows back to the heat absorbing member so as to be available again for heat absorption from the heat generating component.

However, this cooling system still has the following drawbacks. Since the heat absorbing member and the heat dissipating member are connected together by a large number of pipes, it is difficult to give the resultant cooling system a satisfactorily compact structure. The requirement of the large number of pipes also adds assembly complexity to the cooling system and raises the chance of liquid leakage at the joints between the pipes and the components (i.e. the heat absorbing member and the heat dissipating member) of the cooling system. In assembly, mounting of the cooling system will be a tiresome and time-consuming work since the components of the cooling system are required to be assembled separately. Similarly, if the cooling system requires dismounting for the purpose of repair or replacement, the components of the cooling system also require separate disassembling.

Therefore, it is desirable to provide a cooling system which overcomes the aforementioned disadvantages.

SUMMARY OF THE INVENTION

The present invention relates to a cooling system for removing heat from a heat generating component. The cooling system includes a base and a heat sink mounted on the base. The base includes a lower portion and a higher portion surrounding the lower portion. The lower portion and the higher portion cooperatively define a space receiving working fluid therein. The heat sink defines an evaporating passage and two condensing passages located at two opposite sides of the evaporating passage. The passages are in fluid communication with the space. Cooperatively the space and the passages define a loop for circulating the working fluid therein. In the present cooling system, the components thereof, i.e. the base, the heat sink, etc., are combined together to form an integrated structure without using any connecting pipes.

Other advantages and novel features of the present invention will become more apparent from the following detailed description of preferred embodiment when taken in conjunction with the accompanying drawings, in which:

BRIEF DESCRIPTION OF THE DRAWINGS

Many aspects of the present cooling system can be better understood with reference to the following drawings. The components in the drawings are not necessarily drawn to scale, the emphasis instead being placed upon clearly illustrating the principles of the present cooling system. Moreover, in the drawings, like reference numerals designate corresponding parts throughout the several views.

DETAILED DESCRIPTION OF THE INVENTION

Figure 1:
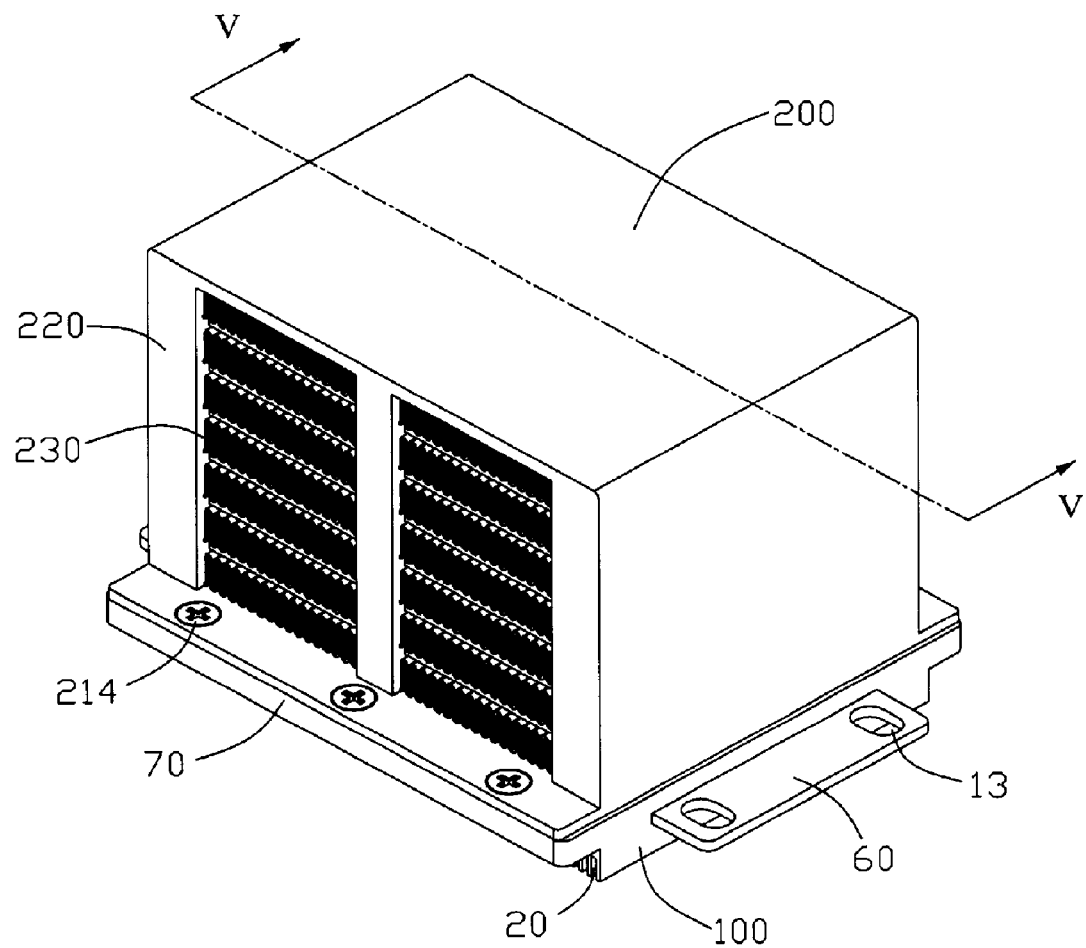
FIG. 1 is an assembled, isometric view of a cooling system in accordance with one embodiment of the present invention.
Figure 2:
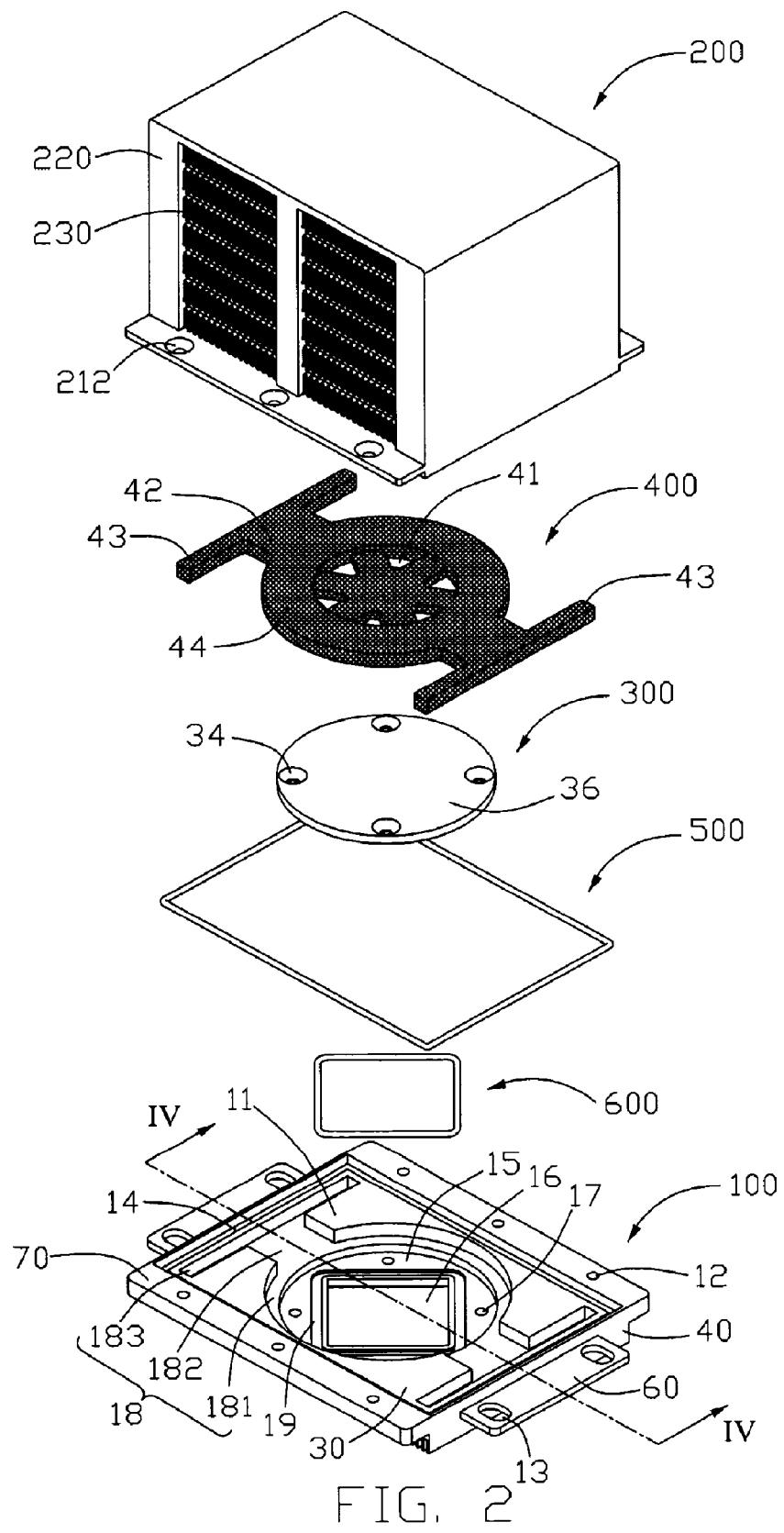
FIG. 2 is an exploded, isometric view of the cooling system of FIG. 1.
Figure 3:
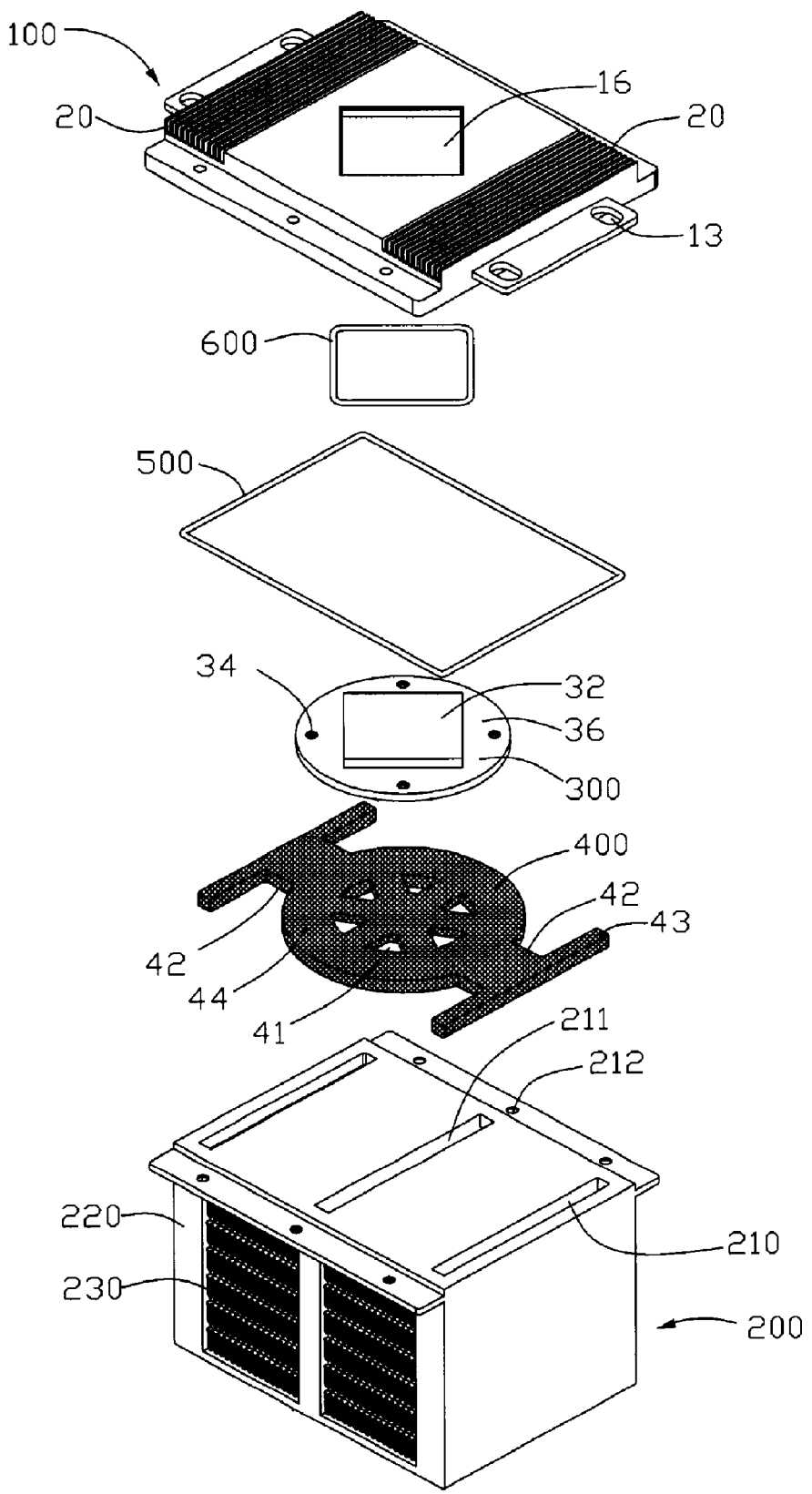
FIG. 3 is similar to FIG. 2, but viewed from another aspect.

FIGS. 1-3 illustrate a cooling system in accordance with a preferred embodiment of the present invention. The cooling system has an integrated structure, which includes a base 100 and a heat sink 200 mounted on the base 100. The base 100 is substantially rectangular shaped. The base 100 includes a pair of mounting sides 60 at left and right sides thereof, and a pair of screwing sides 70 at front and rear sides thereof. Each mounting side 60 defines a pair of mounting holes 13 for extension of mounting members (not shown) such as screws therethrough so as to mount the cooling system to a heat generating component, such as a CPU (not shown) on a printed circuit board (not shown). Each screwing side 70 defines three screwing holes 12 therein. Three through holes 212 are defined in each of front and rear sides of the heat sink 200, aligning with the screwing holes 12 of the corresponding screwing side 70 of the base 100. Screws 214 extend through the through holes 212 and screw in the screwing holes 12 so as to fasten the heat sink 200 and the base 100 together.

Figure 4:
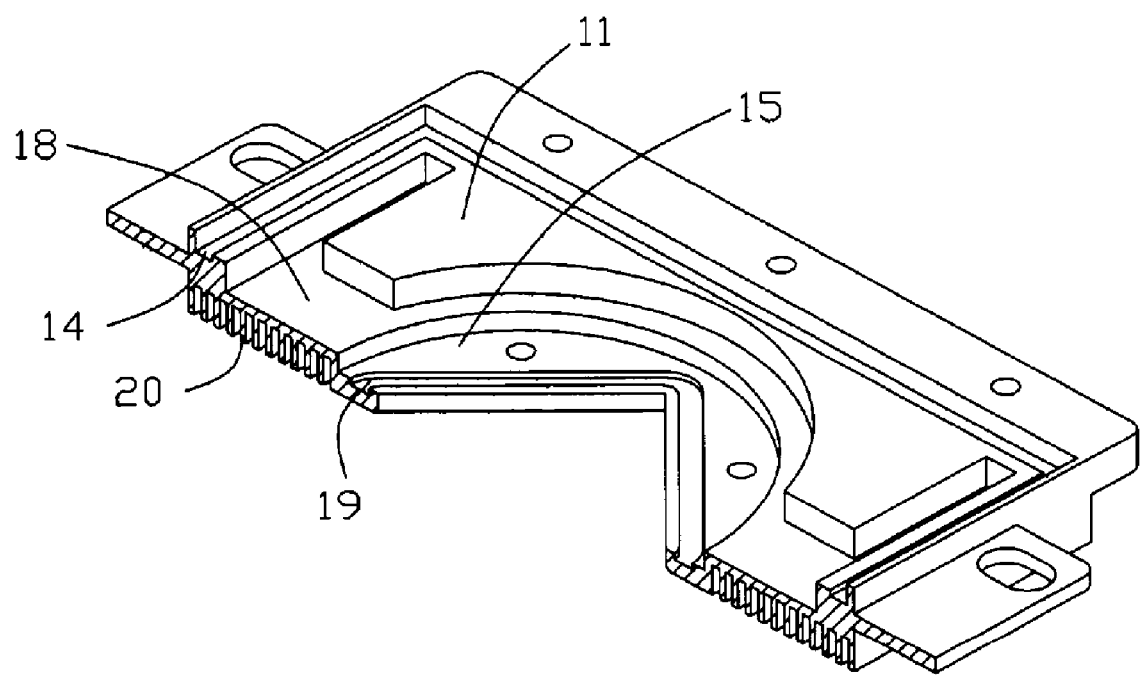
FIG. 4 is a cross-sectional view of a base of the cooling system of FIG. 2.

The base 100 includes a bottom wall 30 and a sidewall 40 surrounding the bottom wall 30. The bottom wall 30 includes a lower portion (not labeled) and a higher portion (not labeled) around the lower portion. The lower portion and the higher portion cooperatively define a space 18 (FIG. 4) for receiving working fluid therein. A diamond-shaped opening 16 is defined in a middle of the lower portion of the bottom wall 30. A groove 19 is defined in the bottom wall 30 around the opening 16 for receiving a first fluid tight seal 600 therein. Four circular holes 17 are defined in the lower portion of the bottom wall 30 adjacent to four sides of the opening 16. A round-shaped indent 15 is defined in the lower portion of the bottom wall 30 and above the opening 16. A circular cavity 181 is defined above the indent 15. The higher portion has two pairs of protrusions 11 extending inwardly from two opposite sides thereof. Each pair of the protrusions 111 defines a channel 182 therebetween. Two chambers 183 are defined between the pairs of the protrusions 11 and the other two opposite sides of the higher portion of the bottom wall 30. The channels 182 communicate the chambers 183 with the cavity 181 of the space 18. A second groove 14 (FIG. 4) is defined adjacent to four side edges of base 100 for receiving a second fluid-tight seal 500 therein. Furthermore, the base 100 includes two fin units 20 which extend downwardly from a bottom surface of the bottom wall 30. The fin units 20 are formed adjacent to the mounting sides 60 of the base 100 and corresponding to the chambers 183, respectively.

The base 100 further includes a heat spreader 300 received therein. The heat spreader 300 is made of a material having relatively high heat conductivity, such as copper, for enhancing the speed of heat transfer from the heat generating component to the cooling system. The heat spreader 300 includes a main body 36 having a shape and size conforming to that of the indent 15 of the bottom wall 30 of the base 100. A contacting portion 32 extends downwardly from the main body 36 for thermally attaching to the heat generating component. The contacting portion 32 has a similar shape and size to that of the opening 16 of the bottom wall 30. Four fixing holes 34 are defined in the main body 36 of the heat spreader 300 corresponding to the circular holes 17 of the base 100.

A wick structure 400 is arranged in the space 18 of the base 100 for generating capillary force to absorb condensed working fluid returning back to the space 18. The wick structure 400 can be made of mesh wires or sintering powders. In this preferred embodiment, the wick structure 400 is made by sintering copper powder. The wick structure 400 includes a circular main portion 44, two end portions 43, and two neck portions 42 interconnected therebetween. The main portion 44 of the wick structure 400 has a same size as the cavity 181 of the base 100 and mounted on the main body 36 of the heat spreader 300. Several cutouts 41 are defined in the main portion 44 of the wick structure 400. The neck portions 42 are received in the channels 182, and the end portions 43 are received in the chambers 183 of the base 100.

Figure 5:
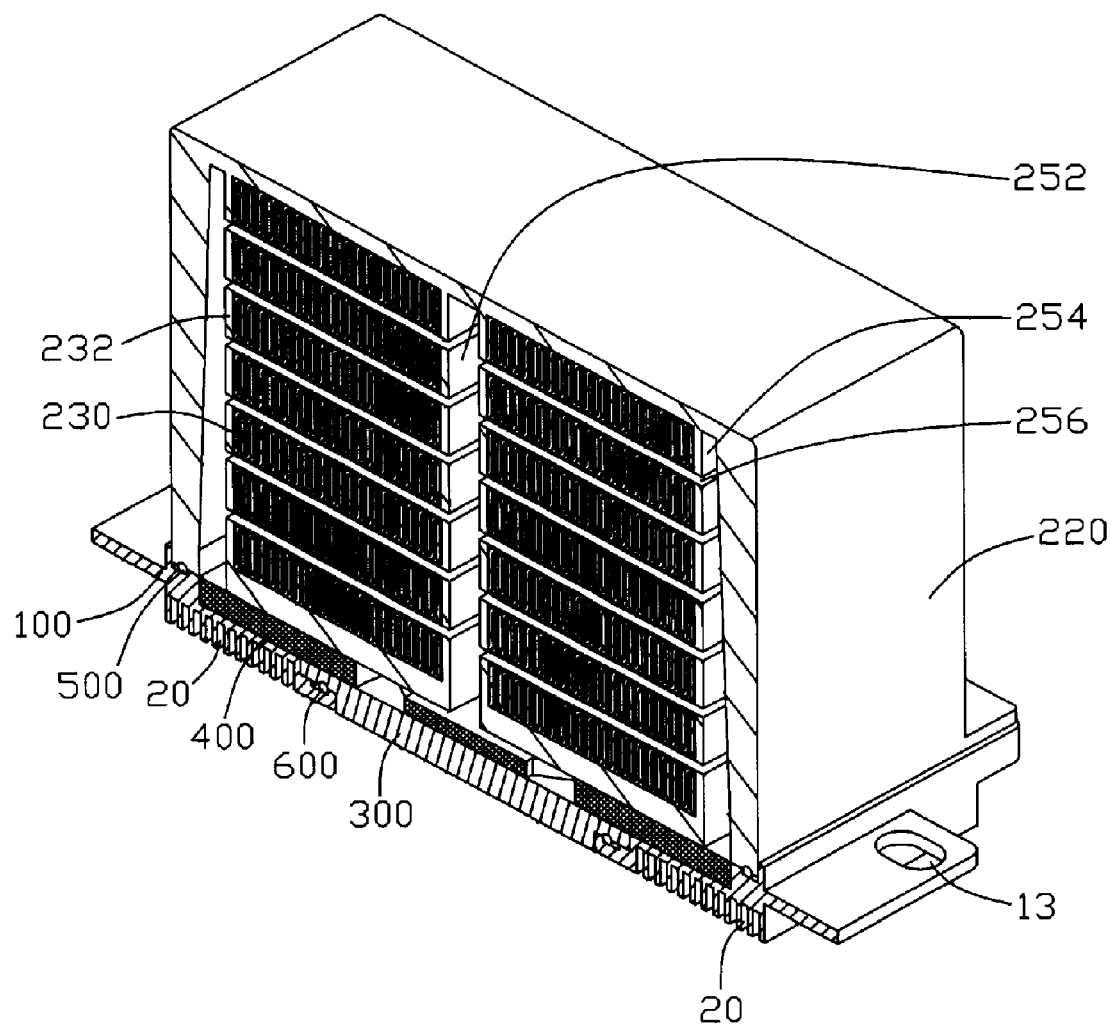
FIG. 5 is a cross-sectional view of the cooling system taken from line V-V of FIG. 1.

With reference to FIG. 5, the heat sink 200 includes a frame 220 and two groups of connecting conduits 256 disposed in the frame 220. The two groups of connecting conduits 256 space a distance from each other and from left and right sides of the frame 220. An evaporating passage 252 is formed between the two groups of the connecting conduits 256, whilst two condensing passages 254 are formed between the connecting conduits 256 and the corresponding left and right sides of the frame 220. The connecting conduits 256 are disposed in parallel with each other along a vertical direction.

A fin member 230 is located between two neighboring upper and lower connecting conduits 256 and maintained in thermal contact with the corresponding connecting conduits 256. Each of the connecting conduits 256 is connected with the evaporating and a corresponding condensing passage 252 (254). The passages 252, 254 define apertures 211, 210 (FIG. 3) at the bottom end of the heat sink 200 to communicate the passages 252, 254 with the space 18 of the base 100. Thus the space 18 of the base 100, the evaporating passage 252, the connecting conduits 256 and the condensing passage 254 cooperatively define a loop for circulating the working fluid therethrough. The evaporating passage 252 is communicated with the cutouts 41 of the main portion 44 of the wick structure 400.

During assembly, the main body 36 of the heat spreader 300 is received in the indent 15 of the lower portion of the base 100 with the contacting portion 32 extending through the opening 16. Screws (not shown) extend through the fixing holes 34 of the heat spreader 300 into the circular holes 19 of the base 100 to assemble the heat spreader 300 to the base 100 together. The first fluid-tight seal 600 is received in the first groove 19 of the base 100 for achieving fluid-tight sealing between the base 100 and the heat spreader 300. The wick structure 400 is received in the cavity 181 of the base 100 with working fluid filled therein. Thus, the base 100, the heat spreader 300 and the wick structure 400 are assembled together. When the heat sink 200 is mounted on the base 100, the second fluid-tight seal 500 is arranged in the second groove 14 of the base 100. Thus, the second fluid-tight seal 500 is located between the base 100 and the heat sink 200 for achieving fluid-tight sealing therebetween. In operation, the contacting portion 32 of the heat spreader 300 is thermally attached to the heat generating component to absorb heat generated thereby. The heat is quickly and evenly conducted to the main body 36 of the heat spreader 300 due to its excellent heat conductivity. The working fluid saturated in main portion 44 of the wick structure 400 absorbs heat from the heat spreader 300 and evaporates into vapor. The vapor moves upwardly from the base 100 to the heat sink 200 along the cutouts 41 of the main portion 44 of the wick structure 400 and the evaporating passage 252. Then the vapor is distributed amongst the connecting conduits 256. As the vapor flows through the connecting conduits 256, the heat of the vapor is released to the fin members 230 of the heat sink 200. The vapor condenses into condensed working fluid and then flows back along the condensing passages 254. The condensed working fluid flows through the apertures 210 into the base 100 so as to be available again for heat absorption from the heat generating component, whereby the heat is continuously removed away as the working fluid is circulated continuously along the heat transfer loop of the cooling system. The condensed working fluid flowing back to the base 100 is first received by the end portions 43 of the wick structure 400. Then it flows backs to the main portion 44 of the wick structure 400 via the neck portions 42 thereof. As the wick structure 400 forms the neck portions 42 and the cutouts 41, the flow resistance of the vapor flowing into the evaporating passage 252 is relatively small compared to that of the vapor flows into the condensing passages 254. Thus the vapor is unlikely to flow to the heat sink 200 through the condensing passages 254. The fin units 20 are directly arranged on the base 100 below the chambers 183, respectively; thus even if there is still any vapor flowing to the chambers 183, the heat of the vapor is released to the fin units 20 and then to the environment. The vapor flowing to the chambers 183 is then condensed into liquid in the chambers 183 of the base 100. This avoids the possibility of interaction between the condensed fluid coming from the condensing passages 254 and the creeping vapor in the chambers 183, thus improving the circulation of the working fluid and accordingly the heat dissipation efficiency of the cooling system.

In the present cooling system, the base 100 and the heat sink 200 are connected together without using any connecting pipes. Therefore, the components of the cooling system can be assembled easily to form an integrated and compact structure, as shown in FIG. 1. Since no connecting pipes are required in the present cooling system, the liquid leakage problem associated with the pipe connections in the prior art is also eliminated. Furthermore, by using only a limited number of screw members, the cooling system as a whole can be easily mounted to the computer in which the CPU is installed for removing heat from the CPU, and can be just as easily dismounted from the computer when the cooling system needs repair or maintenance.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A cooling system for removing heat from a heat generating component, comprising:
    a base comprising a lower portion and a higher portion surrounding the lower portion, the lower portion and the higher portion cooperatively defining a space receiving working fluid therein, the space of the base comprising a middle cavity, two chambers located at two opposite ends of the middle cavity and adjacent to two latitudinal sides of the base, and two narrow channels each located between and communicating a corresponding chamber with the middle cavity;
    a wick structure received in the space of the base, the wick structure comprising a main portion received in the middle cavity of the space, two neck portions received in the narrow channels of the space, and two end portions received in the chambers of the space; and
    a heat sink mounted on the base, the heat sink defining an evaporating passage and two condensing passages located at two opposite sides of the evaporating passage, the evaporating passage being located above and connecting with the main portion of the wick structure, the two condensing passages being respectively located above and connecting with the two end portions of the wick structure, top and bottom surfaces of each of the narrow neck portions of the wick structure connecting with a bottom surface of the heat sink and a top surface of the lower portion of the base, respectively, the passages being in fluid communication with the wick structure received in the base, cooperatively the wick structure and the passages defining a loop for circulating the working fluid therein, the working fluid in the main portion of the wick structure receiving heat and becoming vapor, the vapor flowing first to the evaporating passage and then condensing into liquid when flowing from the evaporating passage to the condensing passages, the liquid then flowing from the condensing passages back to the two end portions of the wick structure.

2. The cooling system of claim 1, wherein the lower portion defines an opening therein, a heat spreader arranged on the base has a contacting portion extending through the opening for thermally attaching to the heat generating component, and the main portion wick structure thermally contacts with the heat spreader.

3. The cooling system of claim 2, wherein a plurality of cutouts are defined in the main portion and communicated with the evaporating passage of the heat sink, a middle of the main portion surrounded by the cutouts being lower than the neck portions of the of the wick structure.

4. The cooling system of claim 3, wherein the main portion of the wick structure is round-shaped.

5. The cooling system of claim 3, wherein the two chambers are defined between the protrusions and the other two opposite latitudinal sides of the higher portion.

6. The cooling system of claim 5, wherein two fin units extend downwardly from two opposite sides of a bottom surface of the base and are located below the two chambers, respectively.

7. The cooling system of claim 5, wherein the condensing passages face to and are in fluid communication with the chambers.

8. The cooling system of claim 1, wherein the higher portion comprises two pairs of protrusions extending inwardly from two opposing longitudinal sides thereof, each of the channels being defined between one of the two pairs of the protrusions.

9. The cooling system of claim 1, wherein the heat sink comprises two groups of spaced connecting conduits with each group being spaced a distance from an adjacent side of the heat sink, the evaporating passage being formed between the connecting conduits, whilst the condensing passages being formed between the connecting conduits and the adjacent sides of the heat sink.

10. The cooling system of claim 9, wherein the connecting conduits in each group are parallel with each other along a vertical direction, and the heat sink further comprises a plurality of fin members sandwiched between and thermally connecting with two adjacent connecting conduits.

11. A cooling system comprising:
    a base defining a space therein;
    a wick structure received in the space of the base and comprising a main portion defining at least a cutout therein and two end portions connecting with two opposite sides of the main portion, respectively;
    a heat sink mounted on the base, having an evaporating passage communicating with the cutout, two condensing passages communicating with the end portions and a plurality of connecting conduits interconnecting the evaporating and condensing passages;
    working fluid received in the wick structure; and
    a plurality of fins thermally connecting with the connecting conduits;
    wherein the working fluid in the main portion of the wick structure absorbs heat to become vapor, the vapor flowing to the evaporating passage via the at least a cutout, then condensing to liquid when flowing from the evaporating passage to the condensing passages, finally the liquid flowing from the condensing passages to the wick structure via the end portions of the wick structure; and
    wherein a plurality of fins are attached to the base at a bottom surface thereof and located correspondingly below the end portions of the wick structure.

12. The cooling system of claim 11, wherein the main portion of the wick structure is round-shaped.

13. The cooling system of claim 11, wherein two necks are formed on the wick structure between the main portion and the end portions of the wick structure, a middle of the main portion surrounded by the at least a cutout being lower than the two necks of the wick structure.

14. The cooling system of claim 13 further comprising a heat spreader located between the wick structure and the base for contacting with a heat-generating electronic device.

* * * * *

UNITED STATES PATENT AND TRADEMARK OFFICE
CERTIFICATE OF CORRECTION

PATENT NO. : 7,661,465 B2 Page 1 of 1
APPLICATION NO. : 11/309516
DATED : February 16, 2010
INVENTOR(S) : Yang et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 716 days.

Signed and Sealed this

Thirtieth Day of November, 2010

David J. Kappos
*Director of the United States Patent and Trademark Office*